(12) United States Patent
Duerig et al.

(10) Patent No.: US 9,431,100 B1
(45) Date of Patent: Aug. 30, 2016

(54) DEVICE AND METHOD FOR STORING OR SWITCHING

(71) Applicant: International Business Machines Corporation, Armonk, NY (US)

(72) Inventors: Urs T. Duerig, Rueschlikon (CH); Armin W. Knoll, Rueschlikon (CH); Elad Koren, Rueschlikon (CH); Emanuel Loertscher, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/820,127

(22) Filed: Aug. 6, 2015

Related U.S. Application Data

(63) Continuation of application No. 14/727,086, filed on Jun. 1, 2015, now Pat. No. 9,281,060.

(51) Int. Cl.
*G11C 13/00* (2006.01)
*G11C 23/00* (2006.01)

(52) U.S. Cl.
CPC ......... *G11C 13/0014* (2013.01); *G11C 13/004* (2013.01); *G11C 13/0069* (2013.01); *G11C 23/00* (2013.01); *G11C 2013/0045* (2013.01)

(58) Field of Classification Search
CPC .......... G11C 13/0014; G11C 13/0016; G11C 13/0019; G11C 23/00; G11C 51/0591
See application file for complete search history.

(56) References Cited

U.S. PATENT DOCUMENTS

| | | | |
|---|---|---|---|
| 6,348,700 B1 | 2/2002 | Ellenbogen et al. | |
| 6,920,260 B2 | 7/2005 | Zhang et al. | |
| 6,947,205 B2 | 9/2005 | Zhang et al. | |
| 7,283,372 B2 | 10/2007 | Weber et al. | |
| 7,732,881 B2 | 6/2010 | Wang | |
| 7,834,467 B2 | 11/2010 | Bauer et al. | |
| 8,711,600 B2 | 4/2014 | Venkataraman et al. | |
| 2006/0062715 A1 | 3/2006 | Endo et al. | |
| 2013/0100726 A1 | 4/2013 | Yi et al. | |
| 2013/0321064 A1 | 12/2013 | Petek et al. | |
| 2015/0069472 A1 | 3/2015 | Despont et al. | |
| 2016/0054260 A1* | 2/2016 | LeBurton ......... G01N 33/48721 204/452 |

FOREIGN PATENT DOCUMENTS

| | | |
|---|---|---|
| WO | WO2014100749 A2 | 6/2014 |
| WO | WO 2014171969 A1 * 10/2014 ....... G01N 33/48721 |

OTHER PUBLICATIONS

Liu, "Nanomechanical Systems from 2D Materials", University of Colorado, Thesis, 2014 [retrieved on Nov. 3, 2015]. Retrieved from Boston University website<URL: http://http://sites.bu.edu/bunch/files/2015/06/Xinghui-Liu-Thesis.pdf>.

(Continued)

*Primary Examiner* — Harry W Byrne
*Assistant Examiner* — Lance Reidlinger
(74) *Attorney, Agent, or Firm* — Scully, Scott, Murphy & Presser, P.C.; Daniel P. Morris, Esq.

(57) ABSTRACT

A method for storing or switching. The method comprises: arranging a first layer including a first molecular network having a first 2D lattice structure and a second layer including a second molecular network having a second 2D lattice structure at a distance from each other such that the first and the second molecular network interact electronically via molecular orbital interactions, and rotating the first layer relative to the second layer by a rotation angle with a rotation device, wherein an electrical resistance between the first molecular network and the second molecular network changes as a function of the rotation angle, thereby storing information by switching the electrical resistance.

14 Claims, 9 Drawing Sheets

(56) References Cited

OTHER PUBLICATIONS

Liu, "Nanomechanical Systems from 2D Materials", Thesis 2014, University of Colorado.

Huang et al., "A multi-state single-molecule switch actuated by rotation of an encapsulated cluster within a fullerene cage," Chemical Physics Letters 552 )2012), available online: Oct. 2, 2012, pp. 1-12.

List of IBM Patents or Patent Applications Treated as Related.

* cited by examiner

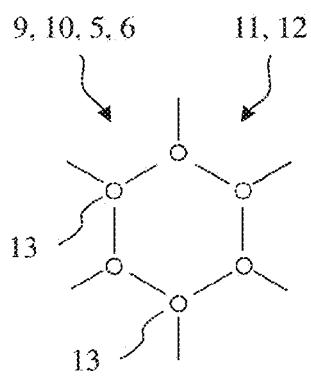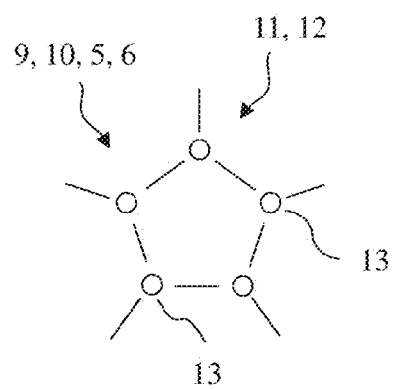
Fig. 3A          Fig. 3B
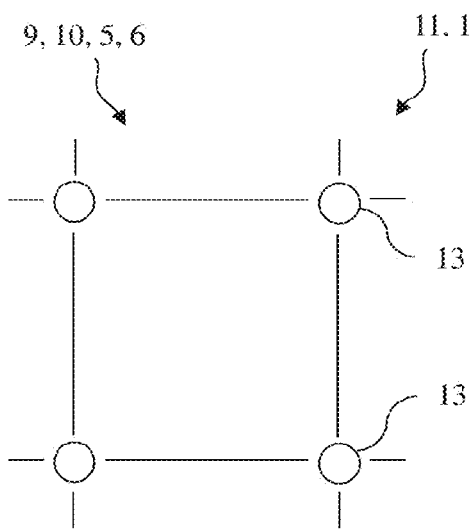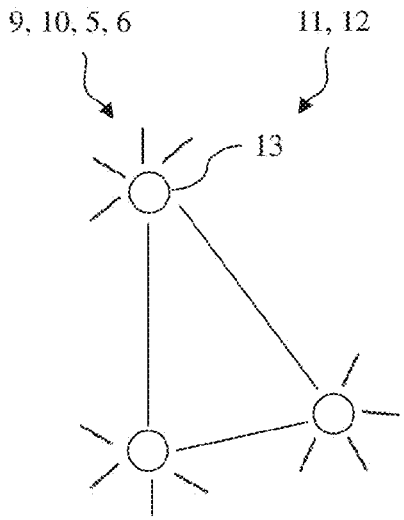
Fig. 3C          Fig. 3D

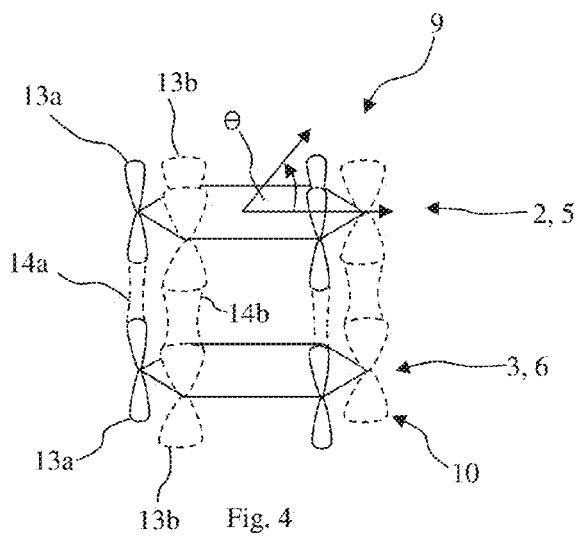
Fig. 4
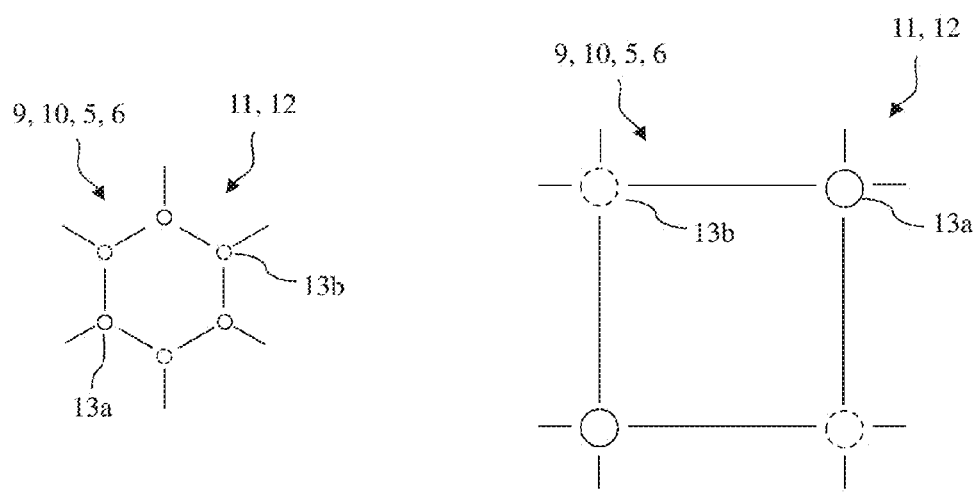
Fig. 5A
Fig. 5B

DEVICE AND METHOD FOR STORING OR SWITCHING

FIELD OF THE INVENTION

The invention relates to a device and a method for storing data or for switching an electrical resistance. Furthermore, the device and the method relate to security or encryption applications.

BACKGROUND

The field of electromechanical memory and switching devices, in particular the field of micro- and nano-electromechanical devices, has become a field of high research activity and technological interest. The capability of storing multi-bit information is one of the challenges in memory technologies. It provides a way to increase the memory density per volume and may pave the way for an improved design on the system level with higher memory density at lower cost. Efforts have been made to develop non-volatile memory devices with reliable data storage at low cost. Among many kinds of memory devices, flash memories which employ a floating gate structure with two programmable charge states are used, wherein their basic operation is based on charge trapping in a floating gate. Nevertheless, flash technology seems to be limited in scaling as charge leakage increases and charge separation becomes increasingly difficult upon scaling down the device dimensions.

US 2013/0321064 A1 discloses a single-molecule switching device. A tunneling current is applied across a tunneling junction, wherein the tunneling junction includes an endohedral fullerene that includes a fullerene cage and a trapped cluster. One or more internal motions of the trapped cluster are excited because of the tunneling current. The conductance of the endohedral fullerene is based on the one or more excited internal motions. One or more electronic processes are controlled based on the changed conductance of the endohedral fullerene.

The current modulation is based on a rotational change of the trapped cluster inside the fullerene cage. In order to induce this rotational change a higher bias potential must be applied. The rotational change is caused by a larger tunneling current through the endohedral fullerene. Therefore, a bias-based switching is disclosed.

BRIEF SUMMARY OF THE INVENTION

According to a first aspect, the invention can be embodied as a device, comprising: a first layer including a first molecular network having a first 2-dimensional (2D) lattice structure, a second layer including a second molecular network having a second 2D lattice structure, wherein the first layer and the second layer are arranged at a distance from each other such that the first and the second molecular network interact electronically via molecular orbital interactions, and a rotation device implemented to rotate the first layer relative to the second layer by a rotation angle, wherein an electrical resistance between the first molecular network and the second molecular network changes as a function of the rotation angle.

According to a second aspect, the invention can be embodied as a method for storing or switching, comprising: arranging a first layer including a first molecular network having a first 2D lattice structure and a second layer including a second molecular network having a second 2D lattice structure at a distance from each other such that the first and the second molecular network interact electronically via molecular orbital interactions, and rotating the first layer relative to the second layer by a rotation angle with a rotation device, wherein an electrical resistance between the first molecular network and the second molecular network changes as a function of the rotation angle, thereby storing information by switching the electrical resistance.

BRIEF DESCRIPTION OF THE DRAWINGS

FIG. 3A to 3D show different 2D lattice structures for the first and second molecular network as shown in FIG. 2A;

FIG. 4 shows alternative heterogeneous molecular building blocks of the first and second 2D layers of FIG. 1 for the case of aligned 2D lattice structures;

FIGS. 5A and 5B show different 2D lattice structures for the first and second molecular network as shown in FIG. 4;

Similar or functionally similar elements in the figures have been allocated the same reference signs if not otherwise indicated.

DETAILED DESCRIPTION OF THE EMBODIMENTS

Figure 1:
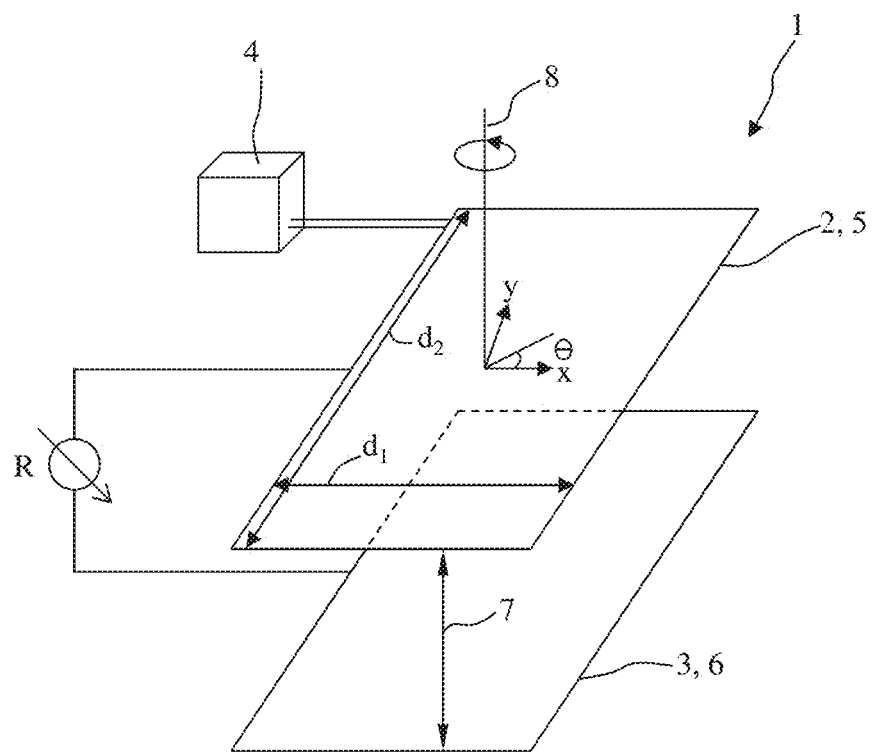
FIG. 1 shows a perspective view of a first embodiment of a device.

FIG. 1 shows a perspective view of a first embodiment of a device 1. The device 1 comprises a first layer 2, a second layer 3 and a rotation device 4. The first layer 2 includes a first molecular network 5 having a first 2D lattice structure. Further, the second layer 3 includes a second molecular network 6 having a second 2D lattice structure.

First and second layer 2, 3 are arranged at a distance 7 from each other. The distance 7 is chosen such that the first and second molecular network 5, 6 interact electronically via molecular orbital interactions. The rotation device 4 can rotate the first layer 2 relative to the second layer 3 by a rotation angle Θ. That means the first layer 2 defines a plane with two orthogonal directions x and y. A rotation axis 8 which can be orthogonal to the first and second layer 2, 3 and to the directions x, y is located somewhere in the first layer 2, preferably in the center of the first layer 2. The first layer 2 can be rotated by the rotation device 4 around the rotation axis 8 by the rotation angle Θ. In an alternative, the second layer 3 is rotated.

An electrical resistance R is measured between the first molecular network 5 and the second molecular network 6. The electrical resistance R changes as a function of the rotation angle Θ.

Therefore, the resistance response pattern upon rotational changes of device 1 is functionally independent from an additional bias voltage. This is in particular the case when operating the device as a memory or resistance switching device. The change in resistance is predominantly induced by the mechanical rotation.

The first layer 2 including the first molecular network 5 and/or the second layer 3 including the second molecular network 6 comprise a first dimension $d_1$ and a second dimension $d_2$. As can be seen in FIG. 1 the first dimension $d_1$ can be smaller than the second dimension $d_2$. In this case the first dimension $d_1$ can be in the range 1 to 100 nm and preferably in the range 5 to 50 nm. However, the first layer 2 including the first molecular network 5 and/or the second layer 3 including the second molecular network 6 can also have a square or circular shape. In this case there is only one dimension d, wherein the parameter d can be in the range 1 to 100 nm and preferably in the range 5 to 50 nm.

Figure 2A:
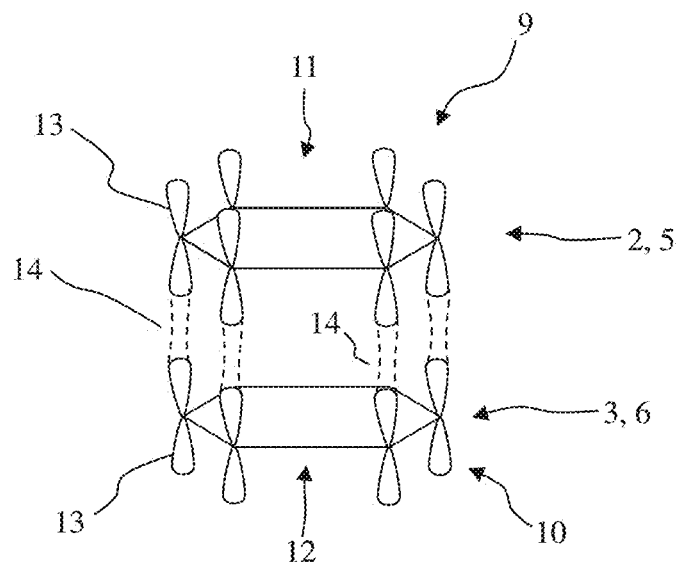
FIG. 2A shows molecular building blocks of the first 2D and the second 2D layer of the device of FIG. 1 when the molecular networks are aligned, hence interaction by molecular orbitals taking place.

FIG. 2A shows a first molecular building block 9 of the first layer 2 and a second molecular building block 10 of the second layer 3 of the device 1 of FIG. 1. As depicted in FIG. 2A the first molecular network 5 and the second molecular network 6 are aligned. Therefore, also the first molecular building block 9 and the second molecular building block 10 are aligned.

The first layer 2 including the first molecular network 5 and/or the second layer 3 including the second molecular network 6 can comprise between 1 and 500000 molecular building blocks 9, 10, preferably between 1 and 1000 molecular building blocks 9, 10 and more preferably between 1 and 500 molecular building blocks 9, 10. That means a layer 2, 3 can comprise a molecular network 5, 6 and the molecular network 5, 6 can comprise one or more molecular building blocks 9, 10.

For example, the first or second molecular network 5, 6 can be implemented as graphene-like systems having a cross-sectional extension in-plane of about 100 nanometers. Then, roughly 100.0000-200.00 benzene-like molecular building blocks 9, 10 are involved.

The molecular building block 9, 10 can comprise molecular orbitals 13 which can be hybridized orbitals, especially $sp^2$ and/or $sp^a$ orbitals. That means also the first molecular network 5 and/or the second molecular network 6 can comprise hybridized orbitals, especially $sp^2$ and/or $sp^a$ orbitals.

The first molecular network 5 has a first 2D lattice structure 11 and the second molecular network 6 has a second 2D lattice structure 12. As can be seen in FIG. 2A the first 2D lattice structure 11 and the second 2D lattice structure 12 can be identical. The 2D lattice structure 11, 12 is given by the number and arrangement of the molecular orbitals 13 of the corresponding molecular building block 9, 10 and the distance between the molecular orbitals 13 of the corresponding molecular building block 9, 10.

As can be seen in FIG. 2A the molecular orbitals 13 of the first molecular network 5 are of the same kind and the molecular orbitals 13 of the second molecular network 6 are of the same kind. Also, the molecular orbitals 13 of the first and second molecular networks 5, 6 can be of the same kind.

The first layer 2 and the second layer 3 can be arranged such that the molecular orbitals 13 of the first molecular network 5 and the molecular orbitals 13 of the second molecular network 6 provide an electronic interaction mechanism 14. Furthermore, the electronic interaction mechanism 14 can be implemented to change the electronic overlap as a function of the rotation angle Θ. When the molecular orbitals 13 of the first molecular building block 9 are arranged above the molecular orbitals 13 of the second molecular building block 10 then a molecular orbital 13 of the first molecular building block 9 strongly electronically interacts forming a hybridized joint molecular orbital 14 to the second molecular building block 10.

Figure 2B:
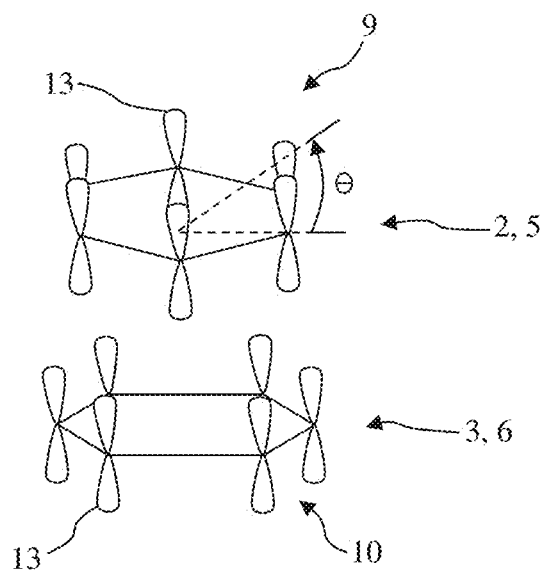
FIG. 2B shows molecular building blocks of the first 2D and the second 2D layer of the device of FIG. 1 when the molecular networks are misaligned, hence no molecular orbital interaction taking place.

FIG. 2B shows the first molecular building block 9 of the first layer 2 and the second molecular building block 10 of the second layer 3 of the device 1 of FIG. 1. As depicted in FIG. 2B the first molecular network 5 and the second molecular network 6 are misaligned.

In contrast to the situation of FIG. 2A in FIG. 2B the first layer 2 has been rotated with rotation angle Θ. As a result the molecular orbitals 13 of the first molecular network 5 and the second molecular network 6 do not provide an electrical interaction 14 any more. Therefore, in the arrangement of the layers 2, 3 as depicted in FIG. 2B the resistance R will be high.

Figure 2C:
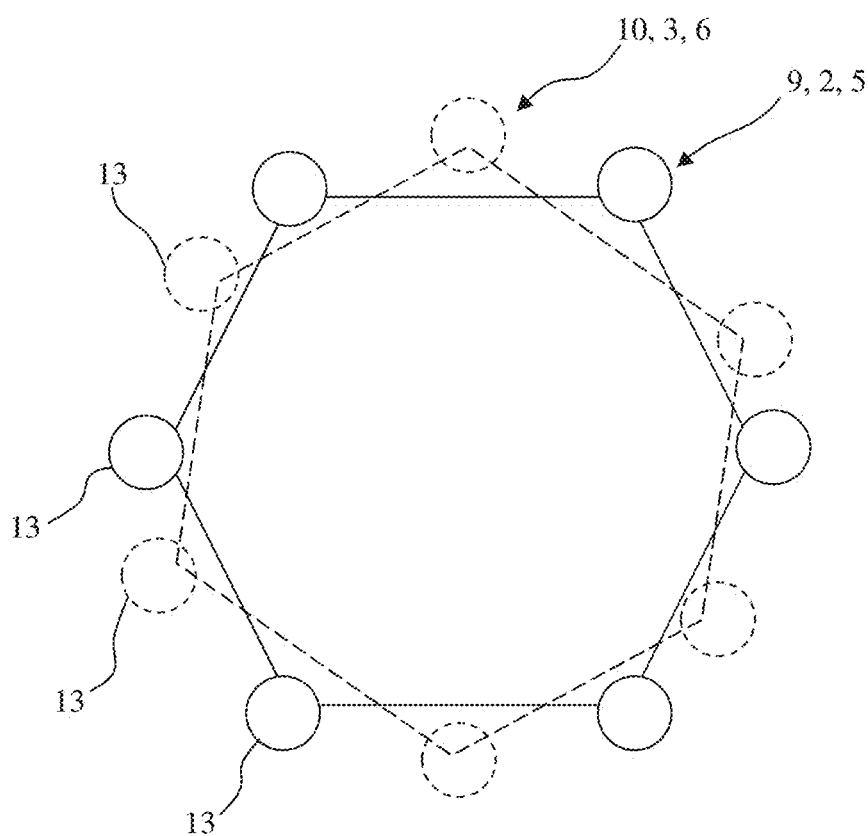
FIG. 2C shows a top view of FIG. 2B.

FIG. 2C shows a top view of FIG. 2B. The solid line corresponds to the first layer 2, the first molecular network 5 and the first molecular building block 9. The dotted line corresponds to the second layer 3, the second molecular network 6 and the second molecular building block 10.

As can be seen when the first molecular building block 9 is arranged to the second molecular building block 10 as depicted in FIG. 2C there is no molecular orbital interaction leading to current suppression between the molecular orbitals 13 of the different molecular building blocks 9, 10.

Figure 2D:
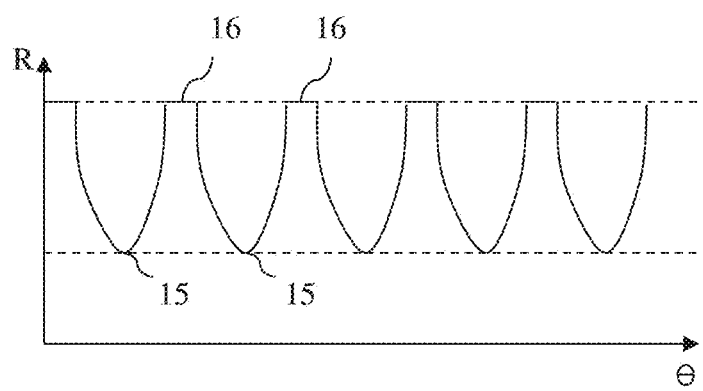
FIG. 2D shows the resistance as a function of the rotation angle for the device having a first layer and a second layer as shown in FIG. 2A.

FIG. 2D shows the electrical resistance R as a function of the rotation angle Θ (solid line) for the device 1 having a first layer 2 and a second layer 3 as shown in FIG. 2A.

When the molecular orbitals 13 of the different molecular building blocks 9, 10 are perfectly aligned above each other (situation as shown in FIG. 2A) then the electrical resistance R has a local minimum. That means the device 1 is in the on state 15 and a current can flow between the first and second layer 2, 3. When the molecular orbitals 13 of the different molecular building blocks 9, 10 are perfectly misaligned (a situation shown in FIGS. 2B and 2C) then the electrical resistance R has a local maximum. That means the device 1 is in the off state 16 and no current will flow between the first and second layer 2, 3.

As can be seen in FIG. 2D the on state 15 is only realized at certain rotation angles Θ. In contrast thereto, the device is in the off state for certain ranges of rotation angles Θ. That is because the electrical interaction 14 is very sensitive to the rotation angle Θ. For the hexagonal 2D lattice structure 11, 12 as shown in FIG. 2A the on state 15 is repeated at an rotation angle Θ of 60°.

FIG. 3A to 3D show different 2D lattice structures 11, 12 for a first and second molecular network 5, 6 as shown in FIG. 2A. As described before, the 2D lattice structure 11, 12 is given by the number of the molecular orbitals 13, by the arrangement of the molecular orbitals 13 and by the distance between the molecular orbitals 13.

In FIG. 3A to 3D is always only one molecular building block 9, 10 depicted. The first 2D lattice structure 11 and/or the second 2D lattice structure 12 can have an arbitrary shape. Especially, the first 2D lattice structure 11 and/or the second 2D lattice structure 12 can have a hexagonal shape (see FIG. 3A), a pentagonal shape (see FIG. 3B), a square shape (see FIG. 3C) and a triangular shape (see FIG. 3D).

FIG. 4 shows alternative molecular building blocks 9, 10 of the first and second layer 2, 3 of FIG. 1 when the molecular networks 5, 6 are aligned. As can be seen from FIG. 4 there are two kinds of interacting molecular orbital situations. There are first molecular orbitals 13a and second molecular orbitals 13b. Further, there are first electrical interactions by hybridized orbitals 14a between first molecular orbitals 13a of two different molecular building blocks 9, 10 and there are second electrical interactions by hybridized orbitals 14b between second molecular orbitals 13b of two different molecular building blocks 9, 10.

In principal, the first molecular network 5 and the second molecular network 6 can comprise molecular orbital interactions of several kinds 13a, 13b, especially two, three or four kinds of molecular orbital interactions 13.

FIGS. 5A and 5B show different 2D lattice structures 11, 12 for a first and second molecular network 5, 6 as shown in FIG. 4. As can be seen in these 2D lattice structures 11, 12 first molecular orbitals 13a alternate with second molecular orbitals 13b. FIG. 5A shows a hexagonal 2D lattice structure 11, 12 and FIG. 5B shows a square 2D lattice structure 11, 12.

Figure 6:
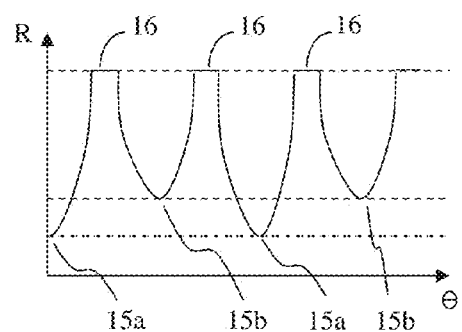
FIG. 6 shows the resistance as a function of the rotation angle for a device having a first layer and a second layer comprising molecular building blocks as shown in FIG. 4.

FIG. 6 shows the electrical resistance R as a function of the rotation angle $\Theta$ for a device 1 having a first layer 2 and a second layer 3 as shown in FIG. 4. The electrical resistance R reaches a local maximum, i.e. an off state 16, when the first molecular network 5 and the second molecular network 6 are perfectly misaligned. However, there are two local minima 15a, 15b of the electrical resistance R. The first local minima, i.e. the first on state 15a, is reached when the molecular orbitals 13a and the molecular orbitals 13b of the two different layers 2, 3 are aligned. The second local minima, i.e. the second on state 15a, is reached when the molecular orbitals 13a of one layer 2, 3 are aligned with molecular orbitals 13b of the other layer 3, 2.

The first molecular network 5 and/or the second molecular network 6 is one of the group of: benzene, graphene, phenyl, oligophenyl, pyridine or tetrathiafulvalene. A preferred material can be phenyl with distinct $sp^2$ orbitals. More complicated are oligophenyles which possess conjugated π-systems and the pitch between them is defined by C—C single, double or triple bonds (C: carbon). Substitution of the C can lead in artificial structures, namely pyridines, tetrathiafulvalene (TTF), etc. The molecular building blocks 9, 10 can be self-linking to each other due to the attractive forces in the orbital landscape, e.g. the p-p stacking in phenyl.

Figure 7:
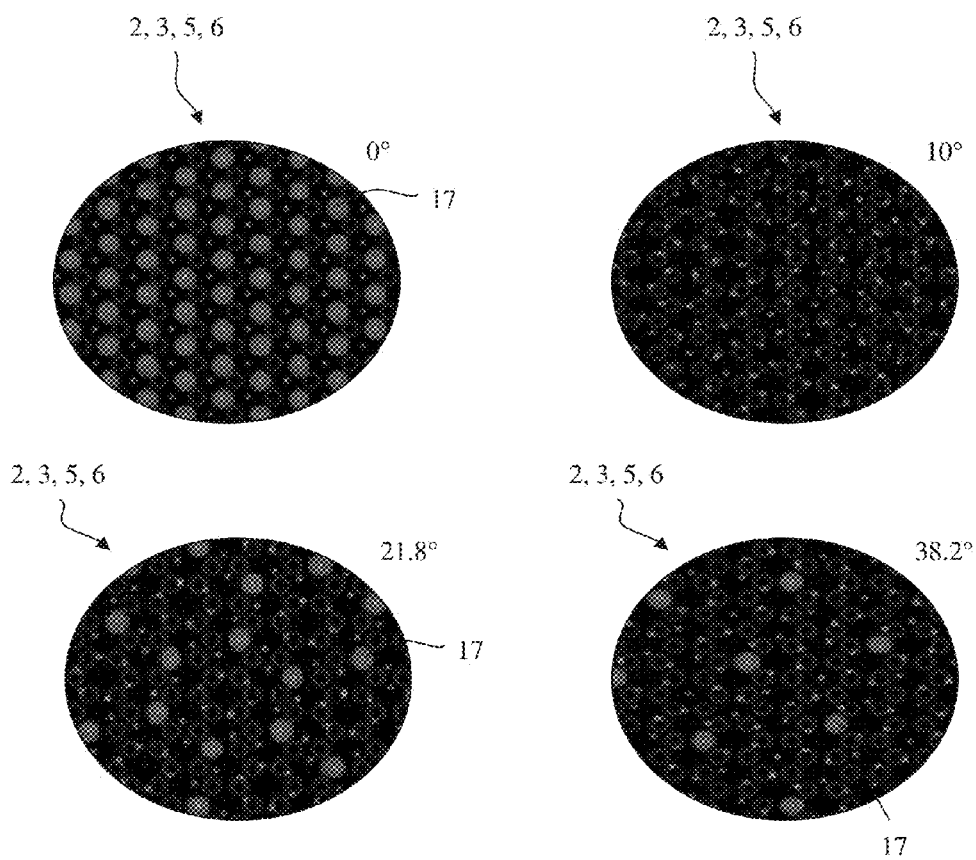
FIG. 7 shows an arrangement of the first and second layer at preferred rotation angles.

FIG. 7 shows an arrangement of the first and second layer 2, 3 at preferred rotation angles $\Theta$. The example of FIG. 7 shows a first and a second layer 2, 3 comprising graphene. FIG. 7 shows four different figures for four different rotation angles $\Theta$. In a first figure the first layer 2 is rotated by a rotation angle $\Theta$ of 0°. That means the first layer 2 is not rotated with respect to the second layer 3. In a second figure the first layer 2 is rotated by a rotation angle $\Theta$ of 10°. In a third figure the first layer 2 is rotated by a rotation angle $\Theta$ of 21.8°. And in a fourth figure the first layer 2 is rotated by a rotation angle $\Theta$ of 38.2°.

There are locations 17 where a first molecular building block 9 and a second molecular building block 10 are aligned. The more of these locations 17 are present at a rotation angle $\Theta$ the lower the electrical resistance R between the first and the second layer 2, 3 is. As can be seen in FIG. 7 the most of these locations 17 can be found by a rotation angle $\Theta$ of 0° and no of these locations 17 can be found for a rotation angle $\Theta$ of 10°. For a rotation angle $\Theta$ of 21.8° more of these locations 17 can be found than for a rotation angle $\Theta$ of 38.2°.

The first layer 2 and the second layer 3 can be arranged such that the electrical resistance R has a local minimum at preferred rotation angles. For a first layer 2 and a second layer 3 comprising graphene, such preferred rotation angles $\Theta$ are 0°, 21.8° and 38.2°.

Figure 8:
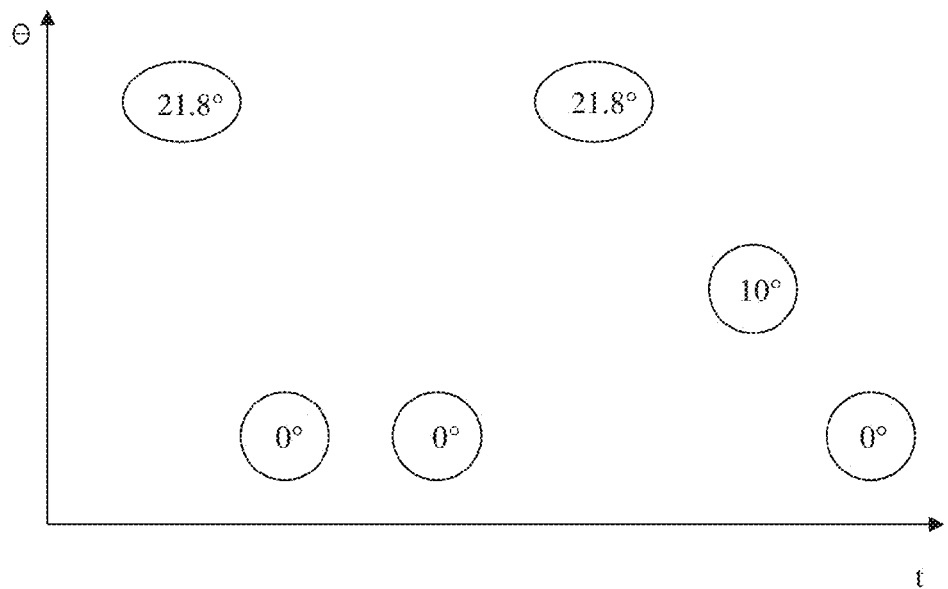
FIG. 8 shows a sequence of the preferred rotation angles shown in FIG. 7 with the time.

FIG. 8 shows a sequence of the preferred rotation angles $\Theta$ shown in FIG. 7 with the time t.

Figure 9:
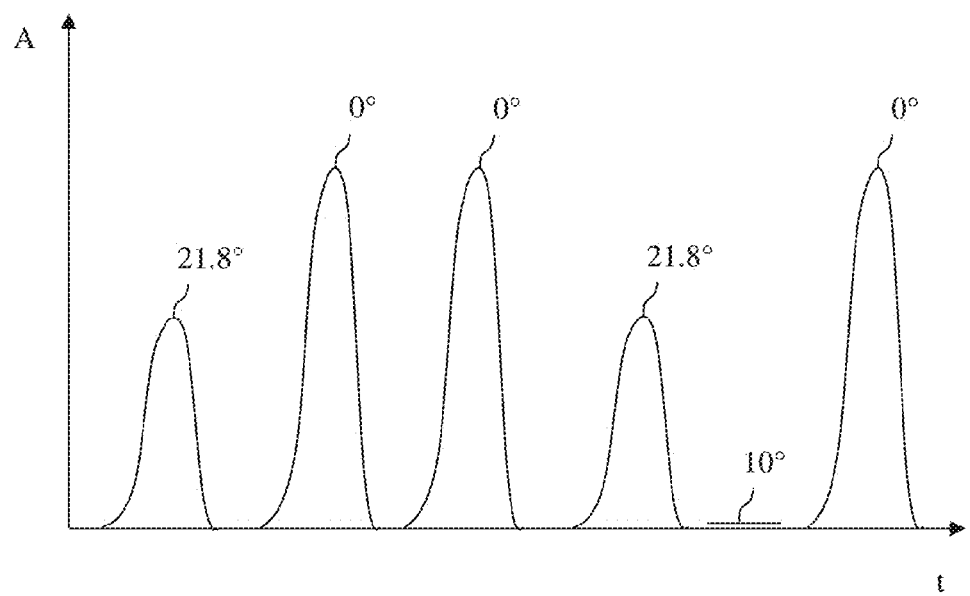
FIG. 9 shows the current corresponding to the sequence as depicted in FIG. 8.

FIG. 9 shows the current A corresponding to the sequence as depicted in FIG. 8. As can be seen the highest current A will flow between first layer 2 and second layer 3 for an rotation angle $\Theta$ of 0°. There will flow some current A for a rotation angle $\Theta$ of 21.8° and there will flow no current A for a rotation angle $\Theta$ of 10°.

Figure 10:
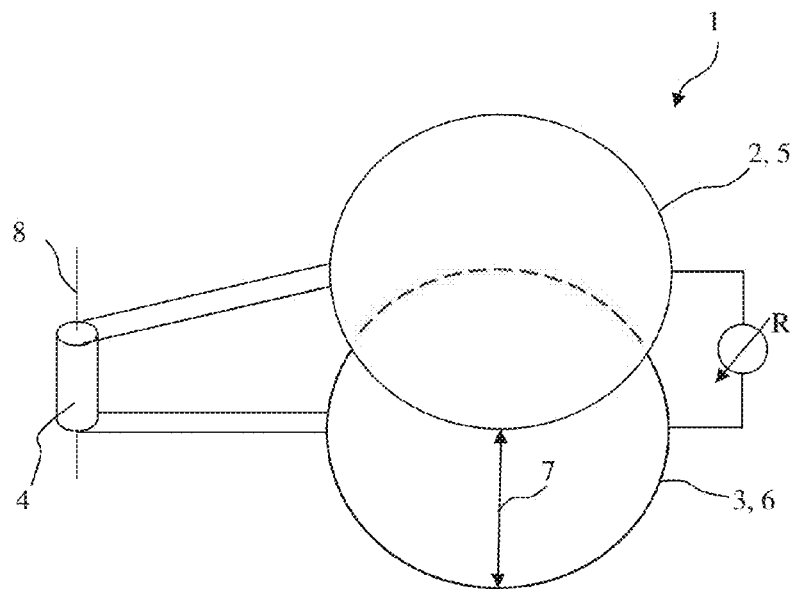
FIG. 10 shows an alternative position of the rotation axis.

FIG. 10 shows an alternative position of the rotation axis 8. The rotation device 4 is implemented to rotate the first layer 2 relative to the second layer 3 about the rotation axis 8, wherein the rotation axis 8 is located outside the first and second layer 2, 3.

Figure 11:
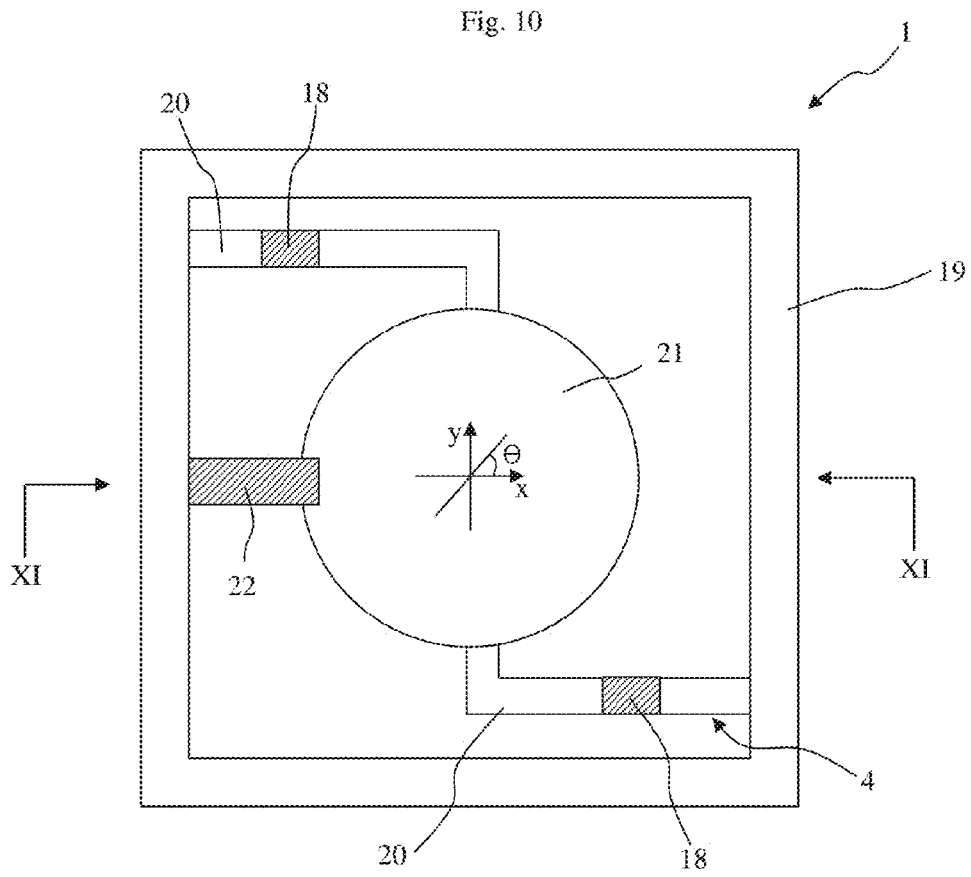
FIG. 11 shows a top view of a second embodiment of a device.

FIG. 11 shows a top view of a second embodiment of the device 1. The rotation device 4 comprises at least one actuator 18 coupled to the first or second layer 2, 3. Especially, the rotation device 4 can comprise one, two, three, four or five actuators 18. The device 1 shown in FIG. 11 comprises two actuators 18.

The device 1 can comprise a housing 19. Further, the rotation device 4 can comprise guide arms 20, wherein the actuators 18 are arranged in the guide arms 20. The guide arms are connected with the first or second layer 2, 3 and the housing 19. Therefore, the guide arms 20 can guide the rotation of the first layer 2 with respect to the second layer 3 or vice versa.

In an alternative the guidance and the actuation can be separated. The guidance can be realized by a bearing. Further, the actuation can be realized with an electro motor, by using a magnetic effect or by using a piezo effect.

Each of the first and the second layer 2, 3 can be in electrical contact with a metal layer 21. Each of the metal layers 21 are contacted by electrical contacts 22.

Figure 12:
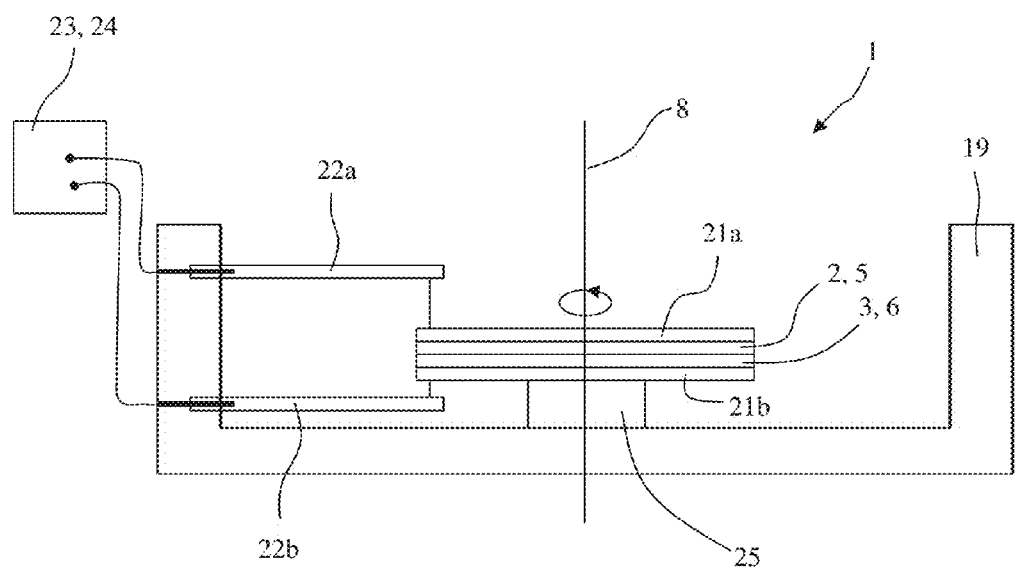
FIG. 12 shows a cross section of the device of FIG. 11.

FIG. 12 shows a cross section of the device of FIG. 11 along the XI-XI line. As can be seen the device 1 can further comprise a device 23 for injecting a current across the first and second layer 2, 3. The device 1 can also comprise a device 24 for measuring the current flowing from the first to the second layer 2, 3. Especially, the device 24 for measuring the current measures the current injected by the device 23 for injecting a current. The device 24 for measuring the current and the device 23 for injecting a current can be one single device.

The device 24 for measuring the current further comprises a first and a second metal layer 21a, 21b, wherein the first layer 2 is in contact with the first metal layer 21a and the second layer 3 is in contact with the second metal layer 21b. Further, a first electrical contact 22a can establish an electrical connection between the first metal layer 21a and the device 24 for measuring the current. Also, a second electrical contact 22b can establish an electrical connection between the second metal layer 21b and the device 24 for measuring the current.

As shown in FIG. 12 the second layer 3 and the second metal layer 21b can be arranged on a carrier 25. The first layer 2 and the first metal layer 21a can rotate with respect to the second layer 3 and the second metal layer 21b.

The first layer 2 can include several first molecular networks 5 layered in a stack and/or the second layer 3 can include several second molecular networks 6 layered in a stack. Handling of the device 1 becomes easier when each of the first and second layer 2, 3 comprises several molecular networks 5, 6 layered in a stack.

Further a method for storing data or for switching an electrical resistance R is described. The method comprises arranging a first layer 2 including a first molecular network 5 having a first 2D lattice structure 11 and a second layer 3 including a second molecular network 6 having a second 2D lattice structure 12 at a distance 7 from each other such that the first and the second molecular network 5, 6 interact electrically. The method further comprises rotating the first layer 2 relative to the second layer 3 by a rotation angle Θ with a rotation device 4. Thereby, an electrical resistance R between the first molecular network 5 and the second molecular network 6 changes as a function of the rotation angle Θ.

Therefore, by manipulating the rotation angle Θ an electrical resistance R can be stored. Further, by manipulating the rotation angle Θ an electrical resistance R can be switched. For security, a series of current signals can be associated with a series of rotation angles Θ. The device and method therefore allow for a non-volatile resistance or information storage. In particular, the resulting relative electrical resistance with respect to different rotational angles is generally defined by the respective angle and not by an additional bias voltage across the layer system. Multilevel memory elements are also feasible.

The electrical resistance R can be stored or switched by a rotation angle Θ in the range of 0.001° and 0.1°, preferably in the range of 0.005° and 0.015°. A sensitivity of 0.01° for rotational changes can be realized.

More generally, while the present invention has been described with reference to certain embodiments, it will be understood by those skilled in the art that various changes may be made and equivalents may be substituted without departing from the scope of the present invention. In addition, many modifications may be made to adapt a particular situation to the teachings of the present invention without departing from its scope. Therefore, it is intended that the present invention not be limited to the particular embodiments disclosed, but that the present invention will include all embodiments falling within the scope of the appended claims.

REFERENCE SIGNS 1 device
2 first layer
3 second layer
4 rotation device
5 first molecular network
6 second molecular network
7 distance
8 rotation axis
9 first molecular building block
10 second molecular building block
11 first 2D lattice structure
12 second 2D lattice structure
13 molecular orbital
13a first molecular orbital
13b second molecular orbital
14 electrical interaction
14a first electrical interaction
14b second electrical interaction
15 on state
15a first on state
15b second on state
16 off state
17 location
18 actuator
19 housing
20 guide arm
21 metal layer
21a first metal layer
21b second metal layer
22 electrical contact
22a first electrical contact
22b second electrical contact
23 device for injecting a current
24 device for measuring the current
25 carrier
x direction
y direction
Θ rotation angle
R electrical resistance
d dimension
$d_1$ first dimension
$d_2$ second dimension
t time
A current

The invention claimed is:

1. A method for storing or switching, comprising:
arranging a first layer including a first molecular network having a first 2D lattice structure and a second layer including a second molecular network having a second 2D lattice structure at a distance from each other such that the first and the second molecular network interact electronically via molecular orbital interactions, and
rotating the first layer relative to the second layer by a rotation angle with a rotation device, wherein an electrical resistance between the first molecular network and the second molecular network changes as a function of the rotation angle, thereby storing information by switching the electrical resistance.

2. The method according to claim 1, wherein the electrical resistance is stored or switched by a rotation angle in the range of 0.001° and 0.1°.

3. The method according to claim 2, wherein the electrical resistance is stored or switched by a rotation angle in the range of 0.005° and 0.015°.

4. The method according to claim 1, wherein a resistance response pattern upon rotational changes is functionally independent from an additional bias voltage applied across the first and/or second layers.

5. The method according to claim 1, wherein the first molecular network and/or the second molecular network comprise molecular orbitals.

6. The method according to claim 5, wherein the molecular orbitals are $sp^2$ and/or $sp^a$ molecular orbitals.

7. The method according to claim 5, further comprising:
arranging the first layer and the second layer such that the molecular orbitals of the first molecular network and the molecular orbitals of the second molecular network electrically interact interaction based on molecular orbital interactions, and
changing an electronic overlap as a function of the rotation angle.

8. The method according to claim 5, wherein the first molecular network and the second molecular network comprise molecular orbitals of the same kind.

9. The method according to claim 5, wherein the first molecular network and the second molecular network comprise two, three or four kinds of molecular orbitals.

10. The method according to claim 1, wherein the first molecular network and/or the second molecular network is one of the group of: benzene, graphene, phenyl, oligophenyl, pyridine or tetrathiafulvalene.

11. The method according to claim 1, further comprising using the rotation device to rotate the first layer relative to the second layer about a rotation axis, wherein the rotation axis is located inside or outside the first and second layer.

12. The method according to claim 1, wherein the first layer and the second layer are arranged such that the electrical resistance has a local minimum at preferred rotation angles.

13. The method according to claim 1, further comprising: injecting a current across the first and second layer.

14. The method according to claim 1, further comprising: measuring the current flowing from the first to the second layer.

* * * * *